United States Patent
Kang et al.

(10) Patent No.: US 7,586,775 B2
(45) Date of Patent: Sep. 8, 2009

(54) NONVOLATILE MEMORY DEVICE AND RELATED METHOD OF OPERATION

(75) Inventors: Sang-beom Kang, Hwaseong-si (KR); Yong-jin Yoon, Gangseo-gu (KR); Qi Wang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 37 days.

(21) Appl. No.: 11/850,130

(22) Filed: Sep. 5, 2007

(65) Prior Publication Data

US 2008/0055964 A1    Mar. 6, 2008

(30) Foreign Application Priority Data

Sep. 6, 2006 (KR) .................. 10-2006-0085680

(51) Int. Cl.
*G11C 11/00* (2006.01)
(52) U.S. Cl. ............. 365/148; 365/189.09; 365/189.11; 365/226
(58) Field of Classification Search ................. 365/148, 365/189.09, 189.11, 226
See application file for complete search history.

(56) References Cited

U.S. PATENT DOCUMENTS

| 6,977,850 B2 * | 12/2005 | Tanzawa .............. 365/189.11 |
| 7,200,039 B2 * | 4/2007 | Lee .................. 365/185.18 |
| 7,369,437 B2 * | 5/2008 | Kamei ................ 365/185.17 |
| 2005/0169095 A1 | 8/2005 | Bedeschi et al. |
| 2007/0053227 A1 * | 3/2007 | Ragone et al. ........ 365/189.09 |

FOREIGN PATENT DOCUMENTS

| JP | 2003007075 A | 1/2003 |
| JP | 2005025914 A | 1/2005 |
| KR | 1020050051135 A | 6/2005 |
| KR | 1020050086289 A | 8/2005 |

\* cited by examiner

*Primary Examiner*—Connie C Yoha
(74) *Attorney, Agent, or Firm*—Volentine & Whitt, PLLC

(57) ABSTRACT

A nonvolatile memory device comprises a first voltage generation unit, a second voltage generation unit, a first circuit block, and a discharge unit. The first voltage generation unit generates a first voltage with a first magnitude. The second voltage generation unit generates a second voltage with a second magnitude greater than the first magnitude. The first circuit block selectively receives the first voltage or the second voltage through an input node. The discharge unit discharges the input node between a time point where the input node has been charged with the second voltage and a time point where the input node receives the first voltage.

19 Claims, 6 Drawing Sheets

Fig. 1

| | 10_1 | 10_2 | 10_3 | 10_4 | 10_5 | 10_6 | 10_7 | 10_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | SA/WD(20_1) || SA/WD(20_2) || SA/WD(20_3) || SA/WD(20_4) ||
| | PERIPHERY(30) |||||||||
| | SA/WD(20_8) || SA/WD(20_7) || SA/WD(20_6) || SA/WD(20_5) ||
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 10_16 | 10_15 | 10_14 | 10_13 | 10_12 | 10_11 | 10_10 | 10_9 |

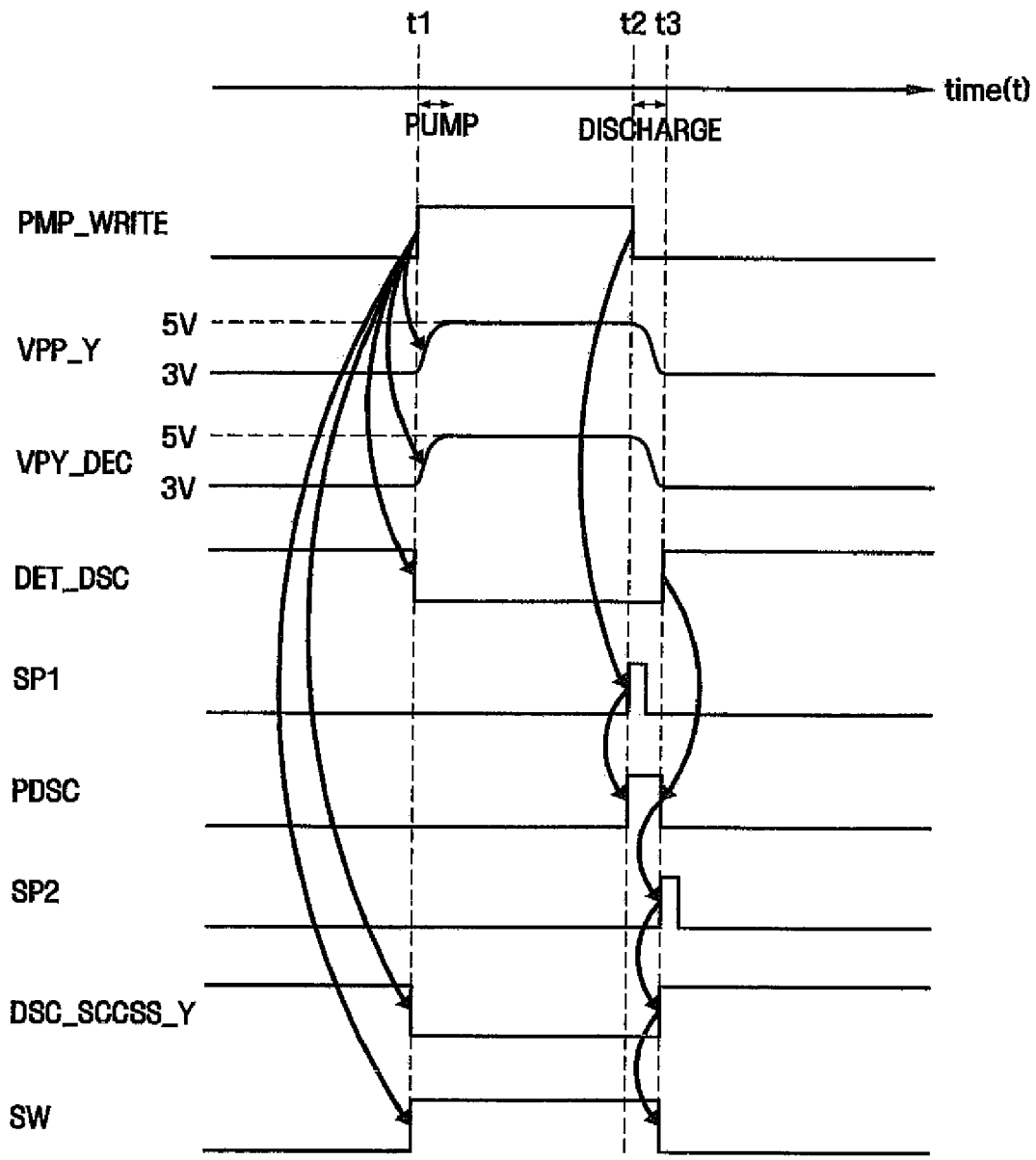

NONVOLATILE MEMORY DEVICE AND RELATED METHOD OF OPERATION

CROSS-REFERENCE TO RELATED APPLICATIONS

This application claims the priority of Korean Patent Application No. 10-2006-0085680, filed on Sep. 6, 2006, the disclosure of which is incorporated by reference in its entirety.

BACKGROUND OF THE INVENTION

1. Field of the Invention

Embodiments of the invention relate generally to nonvolatile memory devices and related methods of operation. More particularly, embodiments of the invention relate to nonvolatile memory devices and methods using resistance materials to store data.

2. Description of Related Art

A variety of nonvolatile memory devices use resistance materials to store data. For example, Phase Change Random Access Memory (PRAM) typically stores data by changing the state of a phase change resistance material between an amorphous state and a crystalline state to discretely modify the resistance of the phase change resistance material. Accordingly, different resistance values of the phase change resistance material can be used to represent logical values "0" and "1" in the PRAM.

Other examples of nonvolatile memory devices using resistance materials include Resistive RAM (RRAM), Ferroelectric RAM (FRAM), and Magnetic RAM (MRAM), to name but a few.

Nonvolatile memory devices such as PRAMs often use a chalcogenide alloy as the phase change resistance material. Accordingly, the logic state of a memory cell in a PRAM can be read by detecting the resistance of the chalcogenide alloy. In selected other nonvolatile memory devices using resistance materials, the logic state of memory cells can be detected by sensing resistance of a Magnetic Tunnel Junction (MTJ) film that varies in accordance with the polarization of a ferroelectric material.

For simplicity of explanation, various concepts will be described below in the context of a nonvolatile memory device in which the phase change resistance material is used to store data. However, those skilled in the art will recognize that the same or similar concepts may be applied to nonvolatile memory devices using other types of resistance materials to store data.

In general, memory cells using phase change resistance materials can be referred to as "phase change memory cells". Phase change memory cells typically store a logical "0" using a "set state" in which the phase change material is in a crystalline state and therefore has a relatively low resistance value. On the other hand, phase change memory cells store a logical "1" using a "reset state" in which the phase change material is in an amorphous state and therefore has a relatively high resistance.

Data can be written to phase change memory cells by heating and cooling the phase change resistance material to change the material between the amorphous and crystalline states. In general the heating and cooling can be accomplished by applying a "set pulse" or a "reset pulse" to an electrode formed adjacent to the phase change resistance material. For example, to program a logical '1' to a phase change memory cell, the phase change resistance material can be heated to a first temperature greater than a melting temperature of the phase change resistance material and then rapidly cooled to place the phase change resistance material in the amorphous state. On the other hand, to program a logical '0' to the phase change memory cell, the phase change resistance material can be heated to a second temperature greater than a crystallization temperature but lower than the melting temperature, maintained at the second temperature for a predetermined period of time, and then cooled to place the phase change resistance in the crystalline state.

The phase change memory cell can be read by applying a read current to the phase change resistance material and detecting a voltage level of a sensing node whose voltage level varies in accordance with the resistance of the phase change resistance material. The voltage level can be detected, for example, by comparing the voltage level with a reference voltage using a sense amplifier and generating an output signal with a logic level based on the comparison.

PRAMs including phase change memory cells such as those described above typically include a memory cell array in which a plurality of phase change memory cells are arranged, decoders for selecting one or more of the phase change memory cells for a write or read operation, a write driver providing one or more set or reset pulses for write operations, and a sense amplifier providing a read current to the selected phase change memory cell for read operations.

The phase change memory cells generally require more than one different boosting voltage to perform the write and read operations. For example, a read boosting voltage is typically required to generate the read current for the read operation and one or more write boosting voltages are generally required to generate the one or more set or reset pulses for the write operation.

The different boosting voltages are often selectively provided to the phase change memory cells through a switching element. However, where the switching element switches between the different boosting voltages used for the respective read and write operations, complications may arise from capacitative effects on lines providing the different boosting voltages. For example, the capacitative effects may cause a voltage apparent on a node connected to the switching element to undesirably increase. Unfortunately, such effects can negatively impact the performance and reliability of nonvolatile devices.

SUMMARY OF THE INVENTION

Accordingly, selected embodiments of the invention provide nonvolatile memory devices and related methods having improved reliability relative to conventional nonvolatile memory devices.

According to one embodiment the invention, a nonvolatile memory device comprises a first voltage generation unit generating a first voltage with a first magnitude, a second voltage generation unit generating a second voltage with a second magnitude greater than the first magnitude, a first circuit block selectively receiving the first voltage and the second voltage through an input node, and a discharge unit discharging the input node between a time point where the input node has been charged with the second voltage and a time point where the input node receives the first voltage.

According to another embodiment of the invention, a nonvolatile memory device comprises a first boosting voltage generation unit generating a first boosting voltage with a first magnitude and outputting the first boosting voltage to a first output node, and a second boosting voltage generation unit generating a second boosting voltage with a second magnitude greater than the first magnitude and outputting the second boosting voltage to a second output node. The device further comprises a first circuit block having an input node, a switching unit selectively coupling the input node with the first output node or the second output node to transfer the first boosting voltage or the second boosting voltage to the first circuit block, and a discharge unit discharging the input node between a time point where the input node has been charged with the second voltage and a time point where the input node receives the first voltage.

According to still another embodiment of the invention, a nonvolatile memory device comprises a circuit block having an input node, a first voltage generation unit generating a first voltage with a first magnitude and outputting the first voltage to a first output node, and a second voltage generation unit generating a second voltage with a second magnitude greater than the first magnitude and outputting the second voltage to a second output node. The device further comprises a switching unit selectively coupling the input node with the first output node or the second output node; and a discharge unit selectively discharging the input node.

According to yet another embodiment of the invention, a method of operating a nonvolatile memory device comprises, during a third time period, coupling an input node of a circuit block with a first output node receiving a first boosting voltage having a first magnitude, wherein the first boosting voltage is generated by a first boosting voltage provision unit. The method further comprises, during a first time period, coupling the input node of the circuit block with a second output node receiving a second boosting voltage having a second magnitude greater than the first magnitude, wherein the second boosting voltage is generated by a second boosting voltage provision unit. The method still further comprises, during a second time period between the first time period and the third time period, discharging the input node from the second magnitude to a lower magnitude.

BRIEF DESCRIPTION OF THE DRAWINGS

The invention is described below with reference to the accompanying drawings. In the drawings, like reference numerals denote like features. In the drawings:

FIG. 1 is a conceptual diagram of a PRAM in accordance with an embodiment of the invention;

FIG. 6 is a timing diagram illustrating the operation of the second discharge control unit of FIG. 5 according to an embodiment of the invention.

DESCRIPTION OF EXEMPLARY EMBODIMENTS

Figure 2:
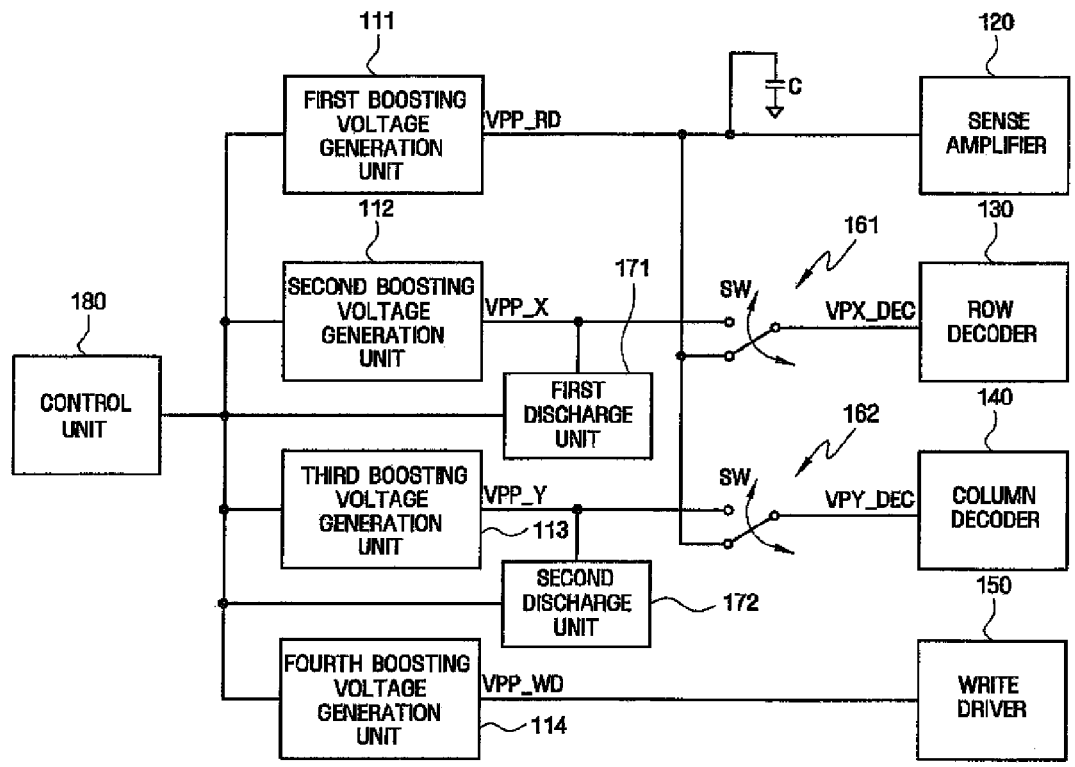
FIG. 2 is a block diagram of a PRAM in accordance with an embodiment of the invention.

Exemplary embodiments of the invention are described below with reference to the corresponding drawings. These embodiments are presented as teaching examples. The actual scope of the invention is defined by the claims that follow.

In general, various inventive concepts are described below using a PRAM as a teaching example; however, those skilled in the art will recognize that several of these concepts may also be applied to other types of nonvolatile memory devices using resistance materials, including, for example, RRAM, FRAM, and MRAM.

FIG. 1 is a conceptual diagram of a PRAM in accordance with one embodiment of the invention. For simplicity of illustration, the PRAM of FIG. 1 includes 16 memory banks; however, the number of memory banks can vary.

Referring to FIG. 1, the PRAM comprises a plurality of memory banks 10_1 through 10_16, a plurality of sense amplifiers/write drivers 20_1 through 20_8, and a peripheral circuit region 30.

Each of memory banks 10_1 through 10_16 comprises a plurality of memory blocks BLK0 through BLK7. Each of memory blocks BLK0 through BLK7 comprises a plurality of phase change memory cells arranged in a matrix. Although each memory bank in FIG. 1 comprises 8 memory blocks, the number of memory blocks per memory bank could be varied.

Each of the phase change memory cells in the PRAM of FIG. 1 comprises a phase change resistance material capable of assuming two different resistance values corresponding to the crystalline state and the amorphous state, respectively. An access device such as a transistor or diode can be used to control current flow through the phase change resistance material.

The phase change resistance material may comprise any of a variety of different compositions or materials. For example, the phase change resistance material may comprise 2-element compositions such as GaSb, InSb, InSe, $Sb_2Te_3$ and GeTe, 3-element compositions such as GeSbTe, GaSeTe, InSbTe, $SnSb_2Te_4$ and InSbGe, and 4-element compositions such as AgInSbTe, (GeSn)SbTe, GeSb(SeTe) and $Te_{81}Ge_{15}Sb_2S_2$. Of these named compositions, GeSbTe is among the most commonly used.

Although not shown in detail in FIG. 1, the PRAM further includes row and column decoders corresponding to memory banks 10_1 through 10_16 and used for selecting rows and columns of phase change memory cells in the PRAM for read and write operations.

Sense amplifiers/write drivers 20_1 through 20_8 each correspond to a pair of memory banks 10_1 through 10_16 and perform read and write operations on the corresponding memory banks. Alternatively, each of sense amplifiers/write drivers 20_1 through 20_8 could correspond to a different number of memory banks, e.g., one, three, or four.

Peripheral circuit region 30 comprises a plurality of logic circuit blocks and a voltage generation unit used to operate various elements such as row decoders, column decoders, and sense amplifiers/write drivers 20_1 through 20_8. For instance, in the PRAM illustrated in FIG. 2, first through fourth boosting voltage generation units 111 through 114, described in further detail below, are disposed in peripheral circuit region 30.

Figure 3:
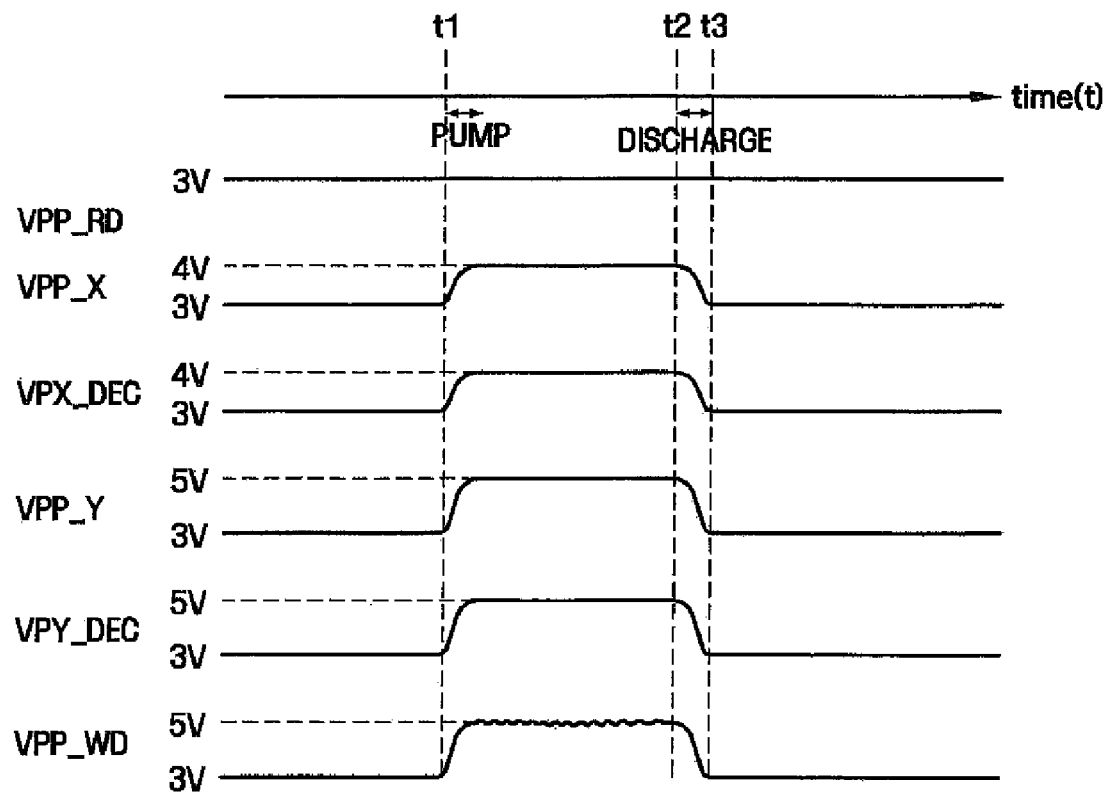
FIG. 3 is a timing diagram illustrating the typical operation of the PRAM in FIG. 2.

FIG. 2 is a block diagram illustrating a PRAM according to an embodiment of the invention and FIG. 3 is a timing diagram illustrating the operation of the PRAM of FIG. 2. Various features described and illustrated in FIGS. 2 and 3, such as boosting voltage generation units, sense amplifiers, write drivers, row decoders, and column decoders, can be considered to illuminate selected details and operations of similar features in the PRAM of FIG. 1 and vice versa.

Referring to FIG. 2, the PRAM comprises first through fourth boosting voltage generation units 111, 112, 113 and 114, a sense amplifier 120, a row decoder 130, a column decoder 140, a write driver 150, a first switching unit 161, a second switching unit 162, a first discharge unit 171, a second discharge unit 172, and a control unit 180, wherein control unit 180 is used to control various features of the PRAM.

First boosting voltage generation unit 111 generates a first boosting voltage and outputs the first boosting voltage through a first output node VPP_RD. Second boosting voltage generation unit 112 generates a second boosting voltage and outputs the second boosting voltage through a second output node VPP_X. Third boosting voltage generation unit 113 generates a third boosting voltage and outputs the third boosting voltage through a third output node VPP_Y. Fourth boosting voltage generation unit 114 generates a fourth boosting voltage and outputs the fourth boosting voltage through a fourth output node VPP_WD.

First boosting voltage generation unit 111 maintains the first boosting voltage at a substantially constant magnitude (e.g., 3V) in modes other than a power down mode. In contrast, second through fourth boosting voltage generation units 112 through 114 maintain the second through fourth boosting voltages at low magnitude (e.g., 3V) most of the time, but generate the second through fourth boosting voltages with a relatively higher magnitude when needed. For example, the level of the second boosting voltage may be generated with a magnitude of about 4V, and the third and fourth boosting voltages may be generated with a magnitude of about 5V. By exposing the PRAM to boosting voltages having relatively higher magnitudes only when needed to perform specific operations, the reliability of the PRAM can be improved.

It should be noted that the operation of first through fourth boosting voltage generation units 111 through 114 could be modified in different embodiments of the invention. For example, first boosting voltage generation unit 111 may also generate and output the first boosting voltage only when needed, and the second through fourth boosting voltage generation units 112 through 114 may continue to generate the respective second through fourth boosting voltages with the relatively higher magnitude in modes other than the power down mode.

Sense amplifier 120 is coupled with first boosting voltage generation unit 111. Row decoder 130 receives the first or second boosting voltage through first switching unit 161. Column decoder 140 receives the first or third boosting voltage through second switching unit 162. In particular, row decoder 130 and column decoder 140 respectively receive the second and third boosting voltages, respectively, during write operations, and receive the first boosting voltage during other operations (e.g., a standby operation or a read operation). Write driver 150 is coupled with fourth boosting voltage generation unit 114.

First switching unit 161 selectively couples a first input node VPX_DEC connected to row decoder 130 with first output node VPP_RD or second output node VPP_X. Second switching unit 162 selectively couples a second input node VPY_DEC connected to column decoder 140 with first output node VPP_RD or third output node VPP_Y.

First discharge unit 171 selectively discharges first input node VPX_DEC, and second discharge unit 172 selectively discharges second input node VPY_DEC. More particularly, first discharge unit 171 discharges first input node VPX_DEC, which has been charged with the second boosting voltage, before row decoder 130 receives first boosting voltage after receiving the second boosting voltage, and second discharge unit 172 discharges second input node VPY_DEC, which has been charged with the third boosting voltage, before column decoder 140 receives the first boosting voltage after receiving the third boosting voltage.

Where the first boosting voltage is provided to first input node VPX_DEC immediately after first input node VPX_DEC has been charged with the second boosting voltage, the voltage level of first input node VPX_DEC may momentarily increase. This increase is due to a sharing of charges between first input node VPX_DEC and first output node VPX_RD and a low capacitance "C" of first output node VPP_RD. Unfortunately, this momentary increase in the voltage level of first input node VPX_DEC may disturb the stable operation of the PRAM.

Similarly, where the first boosting voltage is provided to second input node VPY_DEC immediately after second input node VPY_DEC has been charged with the third boosting voltage, the voltage level of second input node VPY_DEC may momentarily increase. Accordingly, the PRAM of FIG. 2 includes first discharge unit 171 and second discharge unit 172 to prevent or mitigate the above described momentary voltage increases.

Furthermore, first and second discharge units 171 and 172 may respectively discharge first input node VPX_DEC and second input node VPY_DEC to the level of the first boosting voltage or some other voltage level designed to prevent the above described momentary voltage increases.

In FIG. 2, first and second discharge units 171 and 172 are respectively coupled to second and third output nodes VPP_X and VPP_Y; however, first and second discharge units 171 and 172 could also be respectively coupled to first and second input nodes VPX_DEC and VPY_DEC. In other words, first and second discharge units 171 and 172 can be connected to different nodes and still prevent the above described momentary voltage increases.

The operation of the PRAM of FIG. 2 is described in further detail below with reference to FIGS. 2 and 3. More particularly, FIG. 3 includes a waveform timing diagram illustrating the operation of the PRAM in FIG. 2 during four different time periods, namely, a first time period between an initial time and a first time t1, a second time period between first time t1 and a second time t2, a third time period between second time t2 and a third time t3, and a fourth time period after third time t3.

In the first time period, a read operation or a standby operation is performed. During the first time period, first switching unit 161 couples first input node VPX_DEC with first output node VPP_RD, and second switching unit 162 couples second input node VPY_DEC with first output node VPP_RD. In addition, first boosting voltage generation unit 111 outputs the first boosting voltage with a magnitude of about 3V, and second through fourth boosting voltage generation units 112 through 114 each output a low voltage with a magnitude of about 3V, which the PRAM can endure for a relatively long time.

In the second time period, a write operation is performed. During the second time period, first switching unit 161 couples first input node VPX_DEC with second output node VPP_X, and second switching unit 162 couples the second input node VPY_DEC with third output node VPP_Y. In addition, first boosting voltage generation unit 111 continues to output the first boosting voltage with a magnitude of about 3V. Second through fourth boosting voltage generation units 112 through 114 perform voltage pumping operations and respectively output second through fourth boosting voltages. The respective magnitudes of the second through fourth boosting voltages are typically 4V, 5V, and 5V, respectively. First input node VPX_DEC is charged with the second boosting voltage, and second input node VPY_DEC is charged with the third boosting voltage.

In the third time period, a discharge operation is performed to transition between the write operation and another read or standby operation. In the third time period, even though the write operation is completed, first switching unit 161 still couples first input node VPX_DEC with second output node VPP_X, and second switching unit 162 also couples second input node VPY_DEC with third output node VPP_Y.

While first input node VPX_DEC and second output node VPP_X are still coupled with each other, first discharge unit 171 discharges first input node VPX_DEC, which has been charged with the second boosting voltage, to the level of the first boosting voltage. Similarly, while second input node VPY_DEC and third output node VPP_Y are still coupled with each other, second discharge unit 172 discharges second input node VPY_DEC, which has been charged with to the third boosting voltage, to the level of the first boosting voltage.

In the fourth time period, first switching unit 161 couples first input node VPX_DEC with first output node VPP_RD, and second switching unit 162 couples second input node VPY_DEC with first output node VPP_RD.

In this case, first switching unit 161 couples first input node VPX_DEC with first output node VPP_RD, and second switching unit 162 couples second input node VPY_DEC with first output node VPP_RD after the write operation is completed and first and second input nodes VPX_DEC and VPY_DEC are discharged to the level of the first boosting voltage. Accordingly, at the time where first input node VPX_DEC and first output node VPP_RD are coupled with each other, and at the time where second input node VPY_DEC and first output node VPP_RD are coupled with each other, the respective magnitudes of voltages present at first input node VPX_DEC, second input node VPY_DEC, and first output node VPP_RD are prevented from increasing. As a result, the operation of the PRAM is stabilized.

Figure 4:
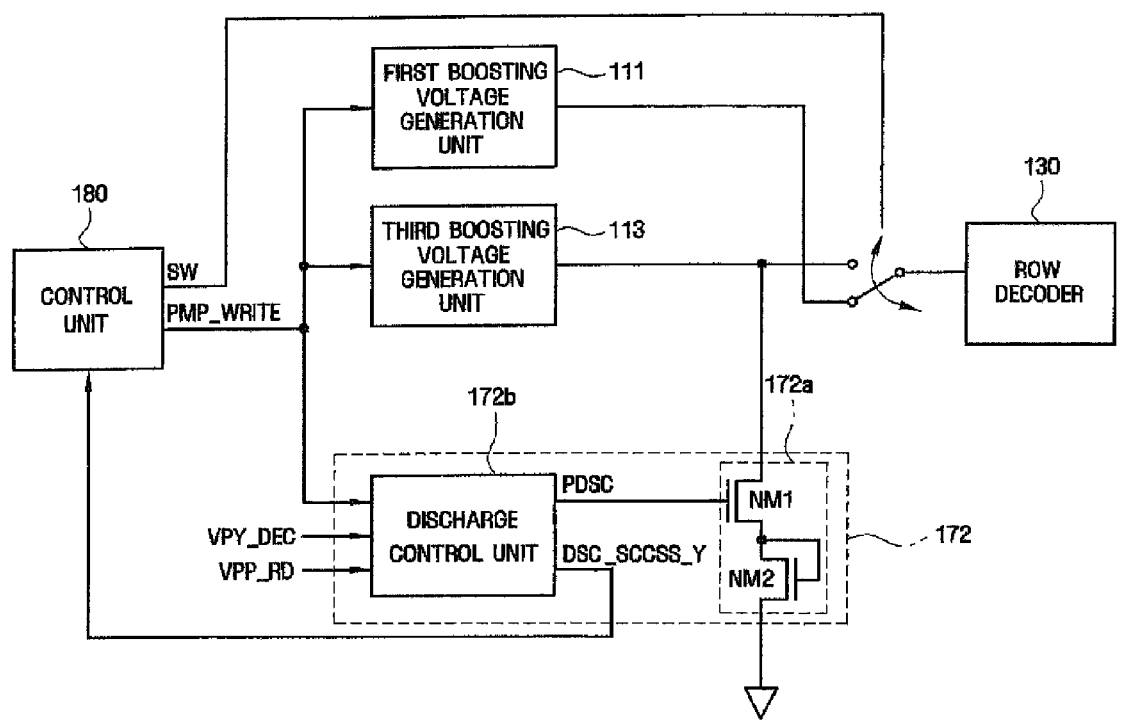
FIG. 4 is a block diagram illustrating a second discharge unit in the PRAM of FIG. 2 according to an embodiment of the invention.
Figure 5:
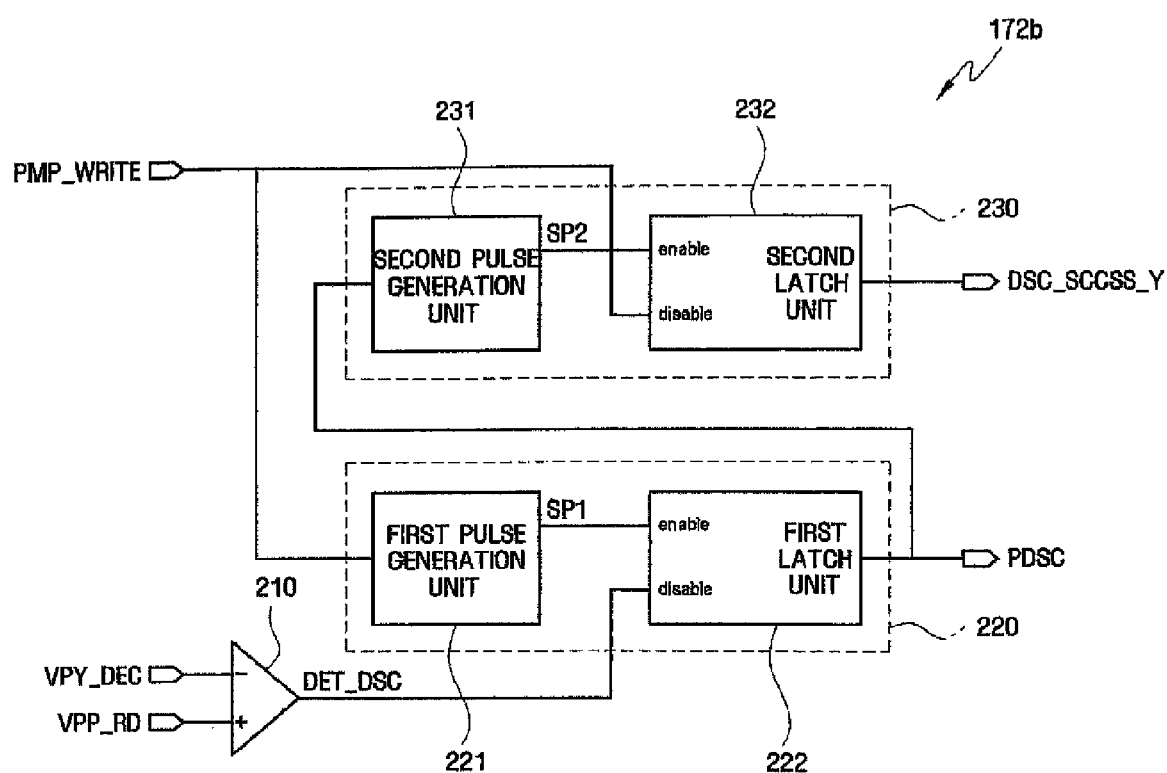
FIG. 5 is a block diagram illustrating a discharge control unit in the second discharge control unit of FIG. 4 according to an embodiment of the invention.

FIG. 4 is a block diagram illustrating second discharge unit 172 of the PRAM in FIG. 3 according to an embodiment of the invention. In FIG. 4, parts of the block diagram of FIG. 2 are shown to provide context for illustrating second discharge unit 172. FIG. 5 is a block diagram illustrating a discharge control unit of FIG. 4 in further detail. FIG. 6 is a timing diagram illustrating the operation of second discharge unit 172 according to an embodiment of the invention.

Referring to FIG. 4, second discharge unit 172 comprises a discharge current generation unit 172a and a discharge control unit 172b.

Discharge current generation unit 172a is typically coupled to second input node VPY_DEC or third output node VPP_Y. In one embodiment, discharge current generation unit 172a comprises a negative metal oxide semiconductor (NMOS) transistor NM1 and a diode NM2 coupled between third output node VPP_Y and ground. In this case, the NMOS transistor NM1 functions to generate discharge current while being turned on/off in response to a discharge execution signal PDSC, and diode NM2 prevents the respective voltage levels of third output node VPP_Y and second input node VPY_DEC from being greatly lowered.

Discharge control unit 172b receives a write enable signal PMP_WRITE, the first boosting voltage apparent on first output node VPP_RD and the voltage apparent on second input node VPY_DEC, and generates discharge execution signal PDSC, which is used to control discharge current generation unit 172a, and a discharge success signal DSC_SCCSS_Y, which indicates the completion of the discharge operation.

Referring to FIG. 5, discharge control unit 172b comprises a comparison unit 210, a discharge execution signal provision unit 220, and a discharge success signal provision unit 230. Comparison unit 210 compares the voltage (first boosting voltage) apparent on first output node VPP_RD with the voltage apparent on second input node VPY_DEC, and generates a signal DET_DSC based on the comparison.

Discharge execution signal provision unit 220 receives write enable signal PMP_WRITE and comparison signal DET_DSC, and generates discharge execution signal PDSC between a time point where write enable signal PMP_WRITE is inactivated and a time point where voltages apparent at second input node VPY_DEC and first output node VPP_RD have the same magnitude.

Discharge execution signal provision unit 220 comprises a first pulse generation unit 221 generating a short pulse SP1 in response to write enable signal PMP_WRITE, and a first latch unit 222 generating discharge execution signal PDSC in response to short pulse SP1 and a comparison signal DET_DSC. More particularly, first pulse generation unit 221 generates short pulse SP1 having a predetermined width (for example, about 50 nsec) in synchronization with a falling edge of write enable signal PMP_WRITE. First latch unit 222 generates discharge execution signal PDSC, which rises in synchronization with a rising edge of short pulse SP1 and falls in synchronization with a rising edge of comparison signal DET_DSC.

Discharge success signal provision unit 230 receives write enable signal PMP_WRITE and discharge execution signal PDSC, and generates discharge success signal DSC_SCCSS_Y.

Discharge success signal provision unit 230 comprises a second pulse generation unit 231 generating a short pulse SP2 in response to discharge execution signal PDSC, and a second latch unit 232 generating discharge success signal DSC_SCCSS_Y in response to short pulse SP2 and write enable signal PMP_WRITE. More particularly, second pulse generation unit 231 generates short pulse SP2 with a predetermined width in synchronization with a falling edge of discharge execution signal PDSC. Second latch unit 232 generates discharge success signal DSC_SCCSS_Y, which rises in synchronization with a rising edge of short pulse SP2.

The operation of the PRAM of FIG. 2 is described in further detail with reference to FIGS. 4 to 6 below. Like FIG. 3, FIG. 6 illustrates the operation of the PRAM during first through fourth time periods.

Referring to FIG. 6, in the first time period, a read operation or standby operation is performed. During the first time period, second switching unit 162 couples second input node VPY_DEC with first output node VPP_RD. First boosting voltage generation unit 111 outputs the first boosting voltage with a magnitude of about 3V such that second input node VPY_DEC and first output node VPP_RD are maintained at a voltage of about 3V.

At time t1, a write operation starts to be performed in response to activation of write enable signal PMP_WRITE. Where write enable signal PMP_WRITE is activated, a switching signal SW assumes a logic level "high", and thus second switching unit 162 couples second input node VPY_DEC with third output node VPP_Y. Furthermore, third boosting voltage generation unit 113 performs a voltage pumping and outputs the third boosting voltage with a magnitude of about 5V. Accordingly, the magnitude of the voltage apparent at third output node VPP_Y increases above the magnitude of the first boosting voltage apparent at first output node VPP_RD. As a result, comparison unit 210 outputs comparison signal DET_DSC with a logic level "low". In addition, second latch unit 232 outputs discharge success signal DSC_SCCSS_Y with logic level "low".

At time t2, the write operation is completed. The discharge operation is performed during the third time period prior to a subsequent read or standby operation beginning at time t3. During the third time period, write enable signal PMP_WRITE assumes logic level "low", and second pulse generation unit 221 generates short pulse SP1 with a predetermined width. First latch unit 222 generates discharge execution signal PDSC with logic level "high" in synchronization with the rising edge of short pulse SP1.

Discharge current generation unit 172a receives discharge execution signal PDSC and discharges third output node VPP_Y and second input node VPY_DEC. At time t3, the discharge operation is completed.

During the third time period, as third output node VPP_Y and second input node VPY_DEC are discharged, the respective magnitudes of the voltages apparent at third output node VPP_Y and second input node VPY_DEC become the same as the magnitude of the voltage (e.g., first boosting voltage) apparent at first output node VPP_RD.

Where the respective voltages apparent third output node VPP_Y and second input node VPY_DEC have the same magnitude as the voltage apparent at first output node VPP_RD, comparison unit 210 outputs comparison signal DET_DSC with logic level "high". First latch unit 222 generates discharge execution signal PDSC with logic level "low" in synchronization with the rising edge of comparison signal DET_DSC. Accordingly, discharge current generation unit 172a receives discharge execution signal PDSC with logic level "low" and completes the discharge operation.

Furthermore, second pulse generation unit 231 generates short pulse SP2 with a predetermined width in synchronization with the falling edge of discharge execution signal PDSC. Second latch unit 232 provides discharge success signal DSC_SCCSS_Y with logic level "high" to control unit 180 in synchronization with the rising edge of short pulse SP2. Control unit 180 provides switching signal SW to second switching unit 162 with logic level "high" in synchronization with a rising edge of discharge success signal DSC_SCCSS_Y. Second switching unit 162 couples second input node VPY_DEC with first output node VPP_RD in response to switching signal SW having logic level "low".

The time point at which second switching unit 162 couples second input node VPY_DEC with first output node VPP_RD is the time point at which the write operation is completed and the voltage apparent at second input node VPY_DEC has the same magnitude as the voltage (i.e., the first boosting voltage) apparent at first output node VPP_RD, rather than the time point (the time t2, that is, the time point at which the write enable signal becomes low) where the write operation is completed. Accordingly, at the time point at which second input node VPY_DEC and first output node VPP_RD are coupled with each other, the voltages of second input node VPY_DEC and first output node VPP_RD can be prevented from increasing rapidly. As a result, the PRAM operates more stably.

Although the PRAM in FIG. 2 only includes first through fourth boosting voltage generation units 111 through 114, sense amplifier 110, row decoder 120, column decoder 130, and write drivers 140, first through fourth boosting voltage generation units 111 through 114 may be replaced with first through fourth voltage generation units generating one or more voltages that are not generated by boosting, and sense amplifier 110, row decoder 120, column decoder 130 and write drivers 140 may be replaced with separate first through fourth circuit blocks.

As described above, in accordance with various embodiments of the invention, a nonvolatile memory device includes a circuit block having an input node. Where the input node has been charged with a second voltage having a higher magnitude than a first voltage, the input node is discharged before the circuit block receives the first voltage. As a result, the voltage level of the input node is prevented from rapidly increasing, thereby improving the stability of operation of the nonvolatile device.

The foregoing exemplary embodiments are disclosed as teaching examples. Those skilled in the art will recognize that various changes may be made to the exemplary embodiments without departing from the scope of the invention as defined by the claims.

What is claimed:

1. A nonvolatile memory device, comprising:
   a first voltage generation unit generating a first voltage with a first magnitude;
   a second voltage generation unit generating a second voltage with a second magnitude greater than the first magnitude;
   a first circuit block selectively receiving the first voltage and the second voltage through an input node; and
   a discharge unit discharging the input node between a time point where the input node has been charged with the second voltage and a time point where the input node receives the first voltage.

2. The nonvolatile memory device of claim 1, further comprising:
   a second circuit block coupled with the first voltage generation unit.

3. The nonvolatile memory device of claim 1, wherein the discharge unit discharges the input node to the first magnitude.

4. The nonvolatile memory device of claim 1, wherein the first and second magnitudes are both greater than a magnitude of a power supply voltage of the nonvolatile memory device.

5. A nonvolatile memory device, comprising:
   a first boosting voltage generation unit generating a first boosting voltage with a first magnitude and outputting the first boosting voltage to a first output node;
   a second boosting voltage generation unit generating a second boosting voltage with a second magnitude greater than the first magnitude and outputting the second boosting voltage to a second output node;
   a first circuit block having an input node;
   a switching unit selectively coupling the input node with the first output node or the second output node to transfer the first boosting voltage or the second boosting voltage to the first circuit block; and
   a discharge unit discharging the input node between a time point where the input node has been charged with the second voltage and a time point where the input node receives the first voltage.

6. The nonvolatile memory device of claim 5, further comprising:
   a second circuit block coupled with the first boosting voltage generation unit.

7. The nonvolatile memory device of claim 6, wherein the first circuit block comprises a row decoder designating a row of a memory cell, or a column decoder designating a column of the memory cell; and
   wherein the second circuit block comprises a sense amplifier.

8. The nonvolatile memory device of claim 7, wherein the switching unit couples the input node with the second output node during a write operation; and
   upon completion of the write operation, the discharge unit discharges the input node from the second magnitude to a lower magnitude, and thereafter, the switching unit couples the input node with the first output node.

9. The nonvolatile memory device of claim 5, wherein the discharge unit discharges the input node to the first magnitude.

10. The nonvolatile memory device of claim 5, wherein the discharge unit comprises:
   a discharge current generation unit coupled with the input node or the second output node; and
   a discharge control unit configured to receive a write enable signal, the first boosting voltage, and a voltage apparent at the input node, and generate a discharge execution signal to control the discharge current generation unit.

11. The nonvolatile memory device of claim 10, wherein the discharge current generation unit comprises a negative metal-oxide semiconductor (NMOS) transistor coupled between the input node and ground or between the second output node and ground.

12. The nonvolatile memory device of claim 10, wherein the discharge control unit comprises:
   a comparison unit comparing the first boosting voltage with the voltage apparent at the input node, and generating a comparison signal based on the comparison; and
   a discharge execution signal provision unit receiving the write enable signal and the comparison signal and generating a discharge execution signal with an activated logic level between a time point where the write enable signal has an inactivated logic level and a time point where the voltage apparent at the input node and the first boosting voltage become substantially identical with each other.

13. The nonvolatile memory device of claim 12, further comprising:
   a discharge success signal provision unit receiving the discharge execution signal and generating a discharge success signal indicating that the input node has been successfully discharged.

14. A nonvolatile memory device, comprising:
   a circuit block having an input node;
   a first voltage generation unit generating a first voltage with a first magnitude and outputting the first voltage to a first output node;
   a second voltage generation unit generating a second voltage with a second magnitude greater than the first magnitude and outputting the second voltage to a second output node;
   a switching unit selectively coupling the input node with the first output node or the second output node; and
   a discharge unit selectively discharging the input node.

15. The nonvolatile memory device of claim 14, wherein the discharge unit discharges the input node between a time point where the input node has been charged with the second voltage and a time point where the input node receives the first voltage.

16. A method of operating a nonvolatile memory device, the method comprising:
   coupling an input node of the circuit block with a first output node receiving a first boosting voltage having a first magnitude, wherein the first boosting voltage is generated by a first boosting voltage provision unit, during a first time period;
   discharging the input node from the first magnitude to a lower magnitude, during a second time period; and
   coupling the input node of a circuit block with a second output node receiving a second boosting voltage having a second magnitude lesser than the first magnitude, wherein the second boosting voltage is generated by a second boosting voltage provision unit, during a third time period.

17. The method of claim 16, wherein the circuit block comprises a row decoder designating a row of a memory cell, or a column decoder designating a column of the memory cell.

18. The method of claim 17, wherein:
   the first time period is a write mode; and
   the third time period is a read mode or a standby mode.

19. The method of claim 16, wherein the input node is discharged to the second magnitude during the second time period.

* * * * *